United States Patent
Wyble et al.

(10) Patent No.: US 10,831,518 B2
(45) Date of Patent: Nov. 10, 2020

(54) OVER-PROVISIONING CLOUD RESOURCES USING DEPENDENCY MAPS AND UTILIZATION TRIGGERS

(71) Applicant: International Business Machines Corporation, Armonk, NY (US)

(72) Inventors: Christopher D. Wyble, Poughkeepsie, NY (US); Gregory J. Boss, Saginaw, MI (US); Ton A. Ngo, Gilroy, CA (US); Simeon D. Monov, San Francisco, CA (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 15/828,461

(22) Filed: Dec. 1, 2017

(65) Prior Publication Data
US 2019/0171472 A1 Jun. 6, 2019

(51) Int. Cl.
| | |
|---|---|
| *G06F 9/455* | (2018.01) |
| *G06F 9/4401* | (2018.01) |
| *G06F 9/50* | (2006.01) |
| *H04L 29/08* | (2006.01) |
| *G06F 9/48* | (2006.01) |
| *G06F 1/32* | (2019.01) |
| *H03M 7/30* | (2006.01) |

(52) U.S. Cl.
CPC ........ *G06F 9/45558* (2013.01); *G06F 9/4418* (2013.01); *G06F 9/5022* (2013.01); *H04L 67/28* (2013.01); *G06F 1/32* (2013.01); *G06F 9/485* (2013.01); *G06F 9/4856* (2013.01); *G06F 2009/45575* (2013.01); *H03M 7/30* (2013.01); *H03M 7/55* (2013.01); *H03M 7/60* (2013.01)

(58) Field of Classification Search
None
See application file for complete search history.

(56) References Cited

U.S. PATENT DOCUMENTS

| | | | | |
|---|---|---|---|---|
| 8,069,362 | B2 * | 11/2011 | Gebhart | G06F 1/3203 713/330 |
| 8,875,132 | B2 | 10/2014 | Falls | |
| 9,183,015 | B2 * | 11/2015 | Corrie | G06F 9/455 |
| 9,262,195 | B2 * | 2/2016 | Tsirkin | G06F 9/45558 |
| 9,489,023 | B1 * | 11/2016 | Ispas | G06F 21/44 |
| 2005/0246718 | A1 | 11/2005 | Erlingsson | |

(Continued)

OTHER PUBLICATIONS

"Gzip", Wikipedia. (Year: 1992).*

*Primary Examiner* — Qing Yuan Wu
(74) *Attorney, Agent, or Firm* — Stephen R. Yoder; David B. Woycechowsky

(57) ABSTRACT

Machine logic (for example, software) for compressing the image of an instance of a VM/container during time period(s) when the VM/container instance is inactive. A proxy is used to handle requests made to the VM/container instance during periods when it is inactive. A dependency graph is used to determine that a related set of instances of VM/containers so that: (i) when one of the VM/container instances of the related set is deactivated, then the whole set of VM/container instances are deactivated together; and/or (ii) when one of the VM/container instances of the related set is reactivated, then the whole set of VM/container instances are reactivated together.

9 Claims, 5 Drawing Sheets

(56) References Cited

U.S. PATENT DOCUMENTS

| | | | |
|---|---|---|---|
| 2011/0225343 A1* | 9/2011 | Takeuchi | G06F 1/3228 |
| | | | 711/6 |
| 2011/0307887 A1 | 12/2011 | Huang | |
| 2014/0245041 A1 | 8/2014 | Ayalur | |
| 2016/0077570 A1* | 3/2016 | Varadarajan | H02J 9/002 |
| | | | 713/322 |
| 2018/0267593 A1* | 9/2018 | Ramasamy | G06F 1/329 |

* cited by examiner

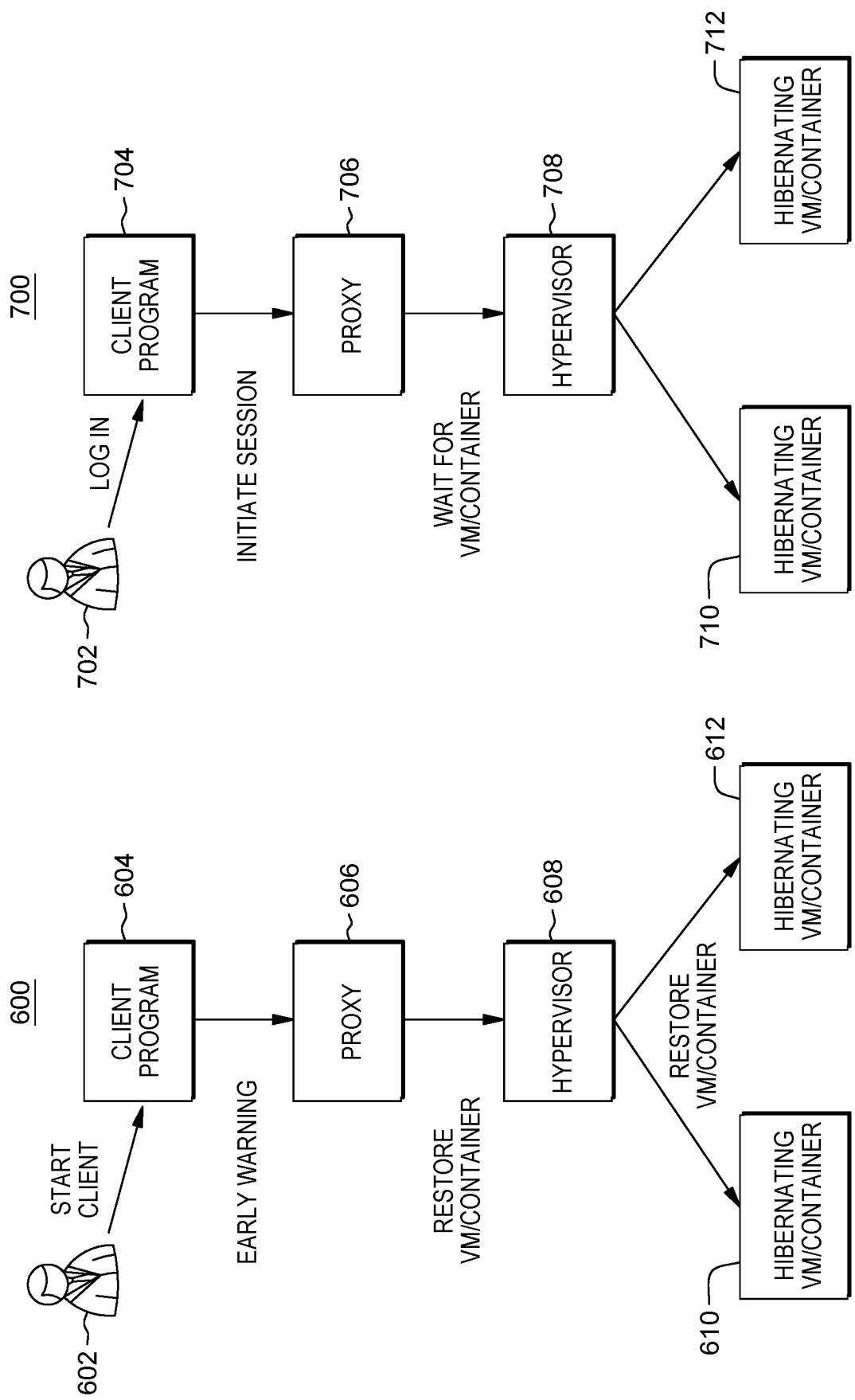

OVER-PROVISIONING CLOUD RESOURCES USING DEPENDENCY MAPS AND UTILIZATION TRIGGERS

BACKGROUND

The present invention relates generally to the field of hibernation of "virtualized computer data sets" (that is, virtual machines (VMs) with hardware level virtualization and containers with operating system level virtualization.

Two currently conventional types are VMs and containers (see definition of VM/container, below).

The Wikipedia entry for "Hibernation (computing)" currently states as follows: "Hibernation (or suspend to disk) in computing is powering down a computer while retaining its state. Upon hibernation, the computer saves the contents of its random access memory (RAM) to a hard disk or other non-volatile storage. Upon resumption, the computer is exactly as it was before entering hibernation." It is a known technique to hibernate VM instances, sometimes along with the server computer upon which the VM resides.

File level compression algorithms, for compressing the data of data sets that are in the form of files, are known. Some known compression protocols can be used to compress many different types of files, such as PKZIP, Gzip, tar, 7z, RAR. These will herein be referred to as agnostic algorithms. Other compression algorithms are designed to compress data of a certain type of file, such as MP3 compression for compressing audio files. These will herein be referred to as file-type-specific compression algorithms/protocols/techniques.

SUMMARY

According to an aspect of the present invention there is a method that performs the following operations (not necessarily in the following order): (i) intercepting, by a proxy, a first data communication communicated over a data communication network and intended for a first instance of a VM/container, with the proxy being a lightweight mechanism that consumes substantially less computing resources than does actively running the first VM/container; (ii) responsive to the interception of the first data communication, parsing, by the proxy, the first data communication to determine a first attribute of the first data communication; (iii) selecting, by the proxy, a first responsive action, with the selection being based, at least in part, upon the first attribute; and (iv) taking, by the proxy, the responsive action.

According to an aspect of the present invention there is a method that performs the following operations (not necessarily in the following order): (i) actively running a first instance of a VM/container on a first computer device; (ii) receiving a request to deactivate the first instance of a VM/container; and (iii) responsive to the request to deactivate, storing an image of the first instance, with the storing including: (a) generating an uncompressed image file data set corresponding to the first instance, (b) compressing, by a file level data compression algorithm, the uncompressed image file data set to generate a compressed image file data set, and (c) storing the compressed image file data set in a data storage device.

According to an aspect of the present invention, the method further includes: (i) receiving a request to reactivate the first instance of the VM/container; and (ii) responsive to the request to reactivate, reactivating the first instance of the VM/container, with the reactivation including: (a) reading the compressed image file data set from the data storage device, (b) decompressing, by the file level data compression algorithm, the compressed image file data set to generate a decompressed image file data set corresponding to the first instance of the VM/container, and (c) activating the decompressed image file data set to begin actively running again the first instance of the VM/container.

According to an aspect of the present invention there is a method that performs the following operations (not necessarily in the following order): (i) receiving an input data set including information indicative of a plurality of instances of VM/containers and a plurality of relationships among and between instances of the plurality of instances; and (ii) generating, by machine logic, a VM/container dependency graph data set representing a dependency graph data structure based upon the input data set, with the dependency graph data structure including: (i) a plurality of nodes respectively corresponding to the instances of the plurality of instances, and (ii) a plurality of connections, with each connection being between a pair of nodes, and with at least some of the connections including information indicating that both nodes of the pair joined by the connection should be deactivated and reactivated together.

According to an aspect of the present invention, the method further includes: (i) receiving a request to deactivate a first instance of the plurality of instances, with the first instance being represented by a first node of the plurality of node data structures; (ii) determining, by machine logic and based on the dependency graph, a subset of node data structure(s) that are directly or indirectly connected to the first node data structure by connection(s) that indicate that instances represented by nodes of the subset should be deactivated and reactivated together; and (iii) responsive to the request to deactivate, deactivating together the first instance and all instances represented by node data structure(s) of the subset.

BRIEF DESCRIPTION OF THE DRAWINGS

FIG. 6 is a block diagram helpful in understanding various embodiments of the present invention; and FIG. 7 is another block diagram helpful in understanding various embodiments of the present invention.

DETAILED DESCRIPTION

Figure 1:
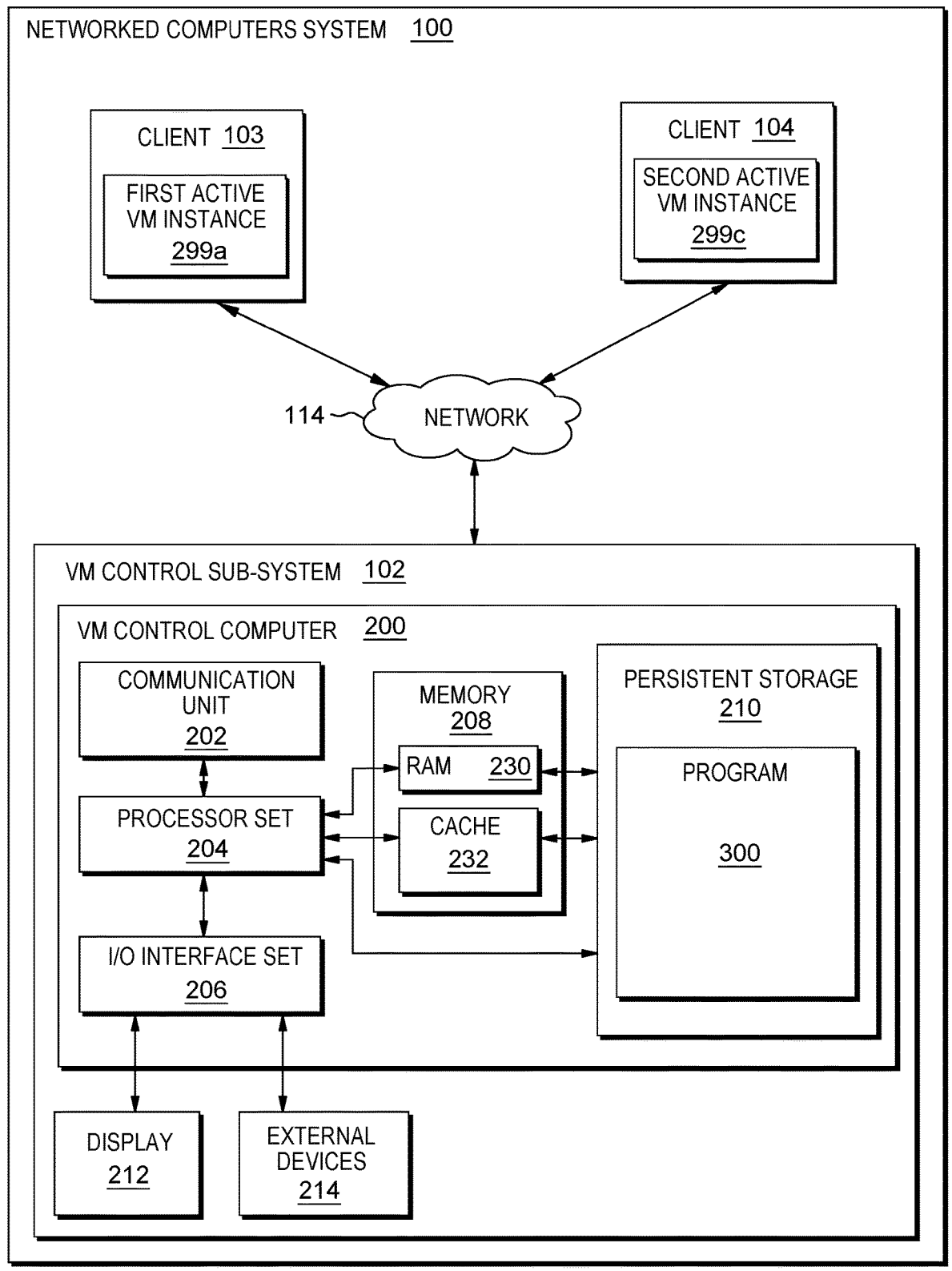
FIG. 1 is a block diagram view of a first embodiment of a system according to the present invention.

Some embodiments of the present invention are directed to machine logic (for example, software) for compressing the image of an instance of a VM/container (see definition of "VM/container," below, in the Definition sub-section of this Detailed description section) during time period(s) when the VM/container instance is inactive. In some embodiments, a proxy is used to handle requests made to the VM/container instance during periods when it is inactive. In some embodiments, a dependency graph is used to determine that a related set of instances of VM/containers so that:

(i) when one of the VM/container instances of the related set is deactivated, then the whole set of VM/container instances are deactivated together; and/or (ii) when one of the VM/container instances of the related set is reactivated, then the whole set of VM/container instances are reactivated together.

This Detailed Description section is divided into the following sub-sections: (i) The Hardware and Software Environment; (ii) Example Embodiment; (iii) Further Comments and/or Embodiments; and (iv) Definitions.

I. The Hardware and Software Environment

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

An embodiment of a possible hardware and software environment for software and/or methods according to the present invention will now be described in detail with reference to the Figures. FIG. 1 is a functional block diagram illustrating various portions of networked computers system 100, including: VM control sub-system 102; server sub-systems 103; server sub-system 104; communication network 114; VM control computer 200; communication unit 202; processor set 204; input/output (I/O) interface set 206; memory device 208; persistent storage device 210; display device 212; external device set 214; random access memory (RAM) devices 230; cache memory device 232; and program 300.

Sub-system 102 is, in many respects, representative of the various computer sub-system(s) in the present invention. Accordingly, several portions of sub-system 102 will now be discussed in the following paragraphs.

Sub-system 102 may be a laptop computer, tablet computer, netbook computer, personal computer (PC), a desktop computer, a personal digital assistant (PDA), a smart phone, or any programmable electronic device capable of communicating with the server sub-systems via network 114. Program 300 is a collection of machine readable instructions and/or data that is used to create, manage and control certain software functions that will be discussed in detail, below, in the Example Embodiment sub-section of this Detailed Description section.

Sub-system 102 is capable of communicating with other computer sub-systems via network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between the computers of networked computers system 100.

Sub-system 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 208 and persistent storage 210 are computer-readable storage media. In general, memory 208 can include any suitable volatile or non-volatile computer-readable storage media. It is further noted that, now and/or in the near future: (i) external device(s) 214 may be able to supply, some or all, memory for sub-system 102; and/or (ii) devices external to sub-system 102 may be able to provide memory for sub-system 102.

Program 300 is stored in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

Program 300 may include both machine readable and performable instructions and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer-readable storage medium that is also part of persistent storage 210.

Communications unit 202, in these examples, provides for communications with other data processing systems or devices external to sub-system 102. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with server computer 200. For example, I/O interface set 206 provides a connection to external device set 214. External device set 214 will typically include devices such as a keyboard, keypad, a touch screen, and/or some other suitable input device. External device set 214 can also include portable computer-readable storage media such as, for example, thumb drives, portable optical or magnetic disks, and memory cards. Software and data used to practice embodiments of the present invention, for example, program 300, can be stored on such portable computer-readable storage media. In these embodiments the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

II. Example Embodiment

Figure 2:
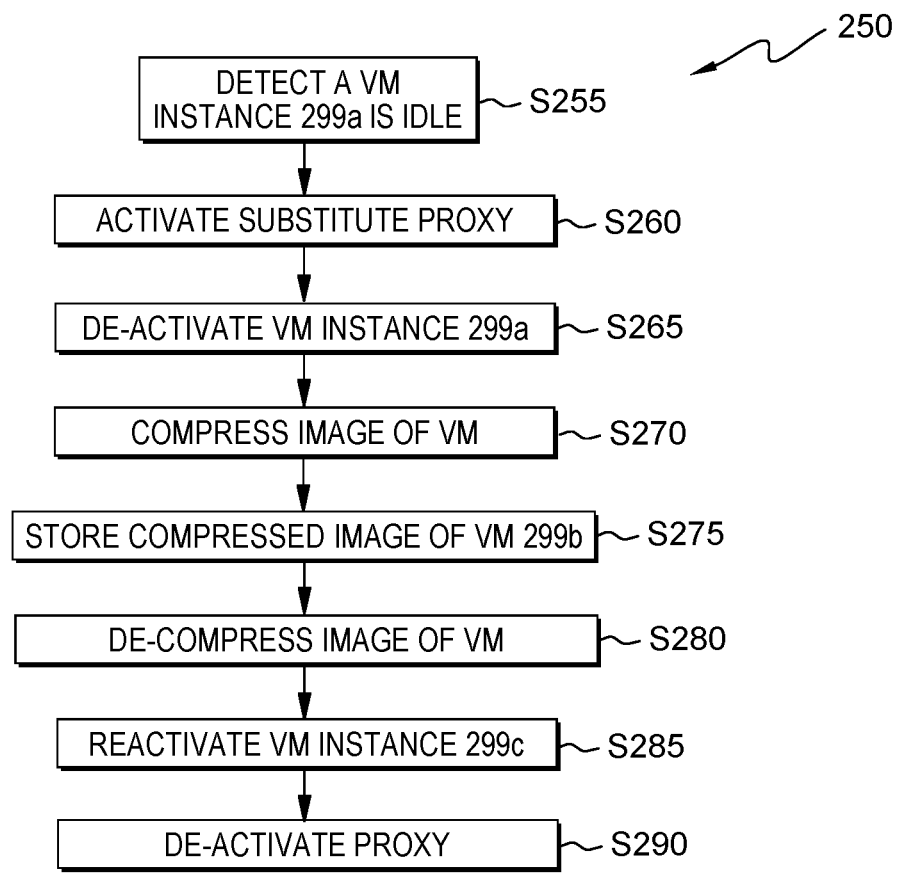
FIG. 2 is a flowchart showing a first embodiment of a method performed, at least in part, by the first embodiment system.
Figure 3:
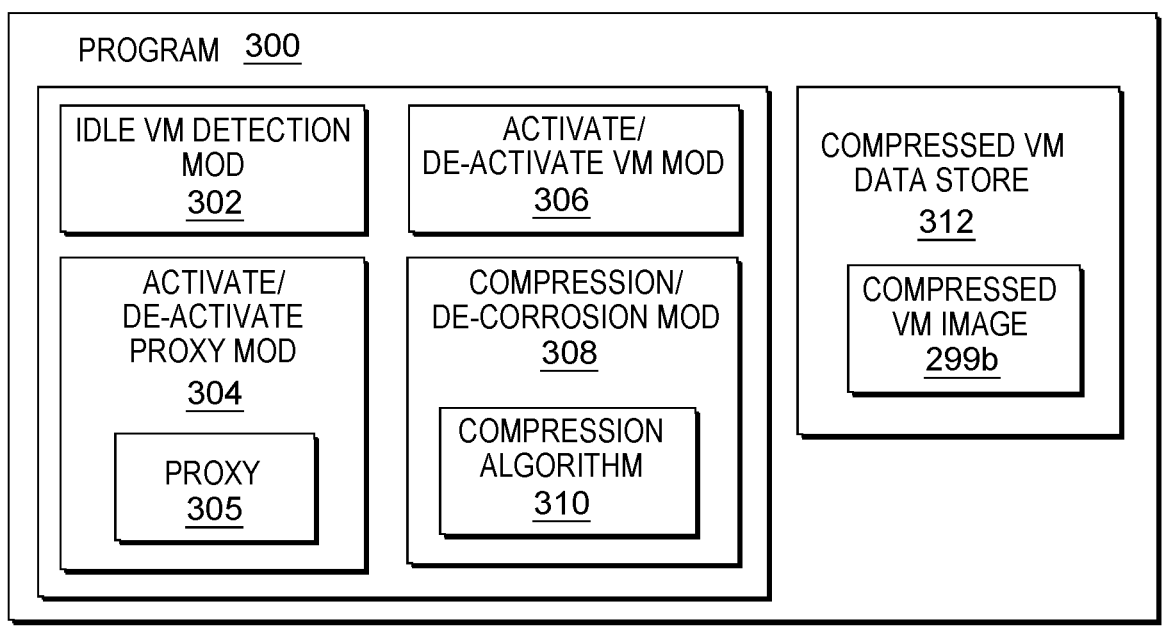
FIG. 3 is a block diagram showing a machine logic (for example, software) portion of the first embodiment system.

FIG. 2 shows flowchart 250 depicting a method according to the present invention. FIG. 3 shows program 300 for performing at least some of the method operations of flowchart 250. This method and associated software will now be discussed, over the course of the following paragraphs, with extensive reference to FIG. 2 (for the method operation blocks) and FIG. 3 (for the software blocks).

Processing begins at operation S255, where idle VM detection module ("mod") 302 of program 300 of VM control computer 200 of VM control sub-system 102 detects that active VM instance 299a of server sub-system 103 has been idle for some pre-determined amount of time. For this reason, instance 299a will be de-activated and compressed and a proxy will be put into its place. Alternatively or additionally, other triggering conditions can be used to determine that instance 299a is to be deactivated, such as deactivation during predetermined times of the day. Also, some deactivation determinations may be made using a dependency graph, which possibility will be further discussed below.

Processing proceeds to operation S260, where activate/deactivate proxy mod 304 activates proxy 305 to handle data communications intended for instance 299. A "proxy," by definition, intercepts all data communications that are intended for the thing(s) for which the proxy is proxying. In this simple example, proxy 305 only intercepts data communications intended for instance 299, and is only activated when instance 299 is deactivated. Alternatively, a single proxy can serve as proxy for many different VM/container instances, and/or the proxy can be active even when the VM/container is activated (for example, the proxy may simply pass through the data communications it intercepts when the target of the data communication is an active VM/container). The definition of a "proxy" (as that term is used herein) will be further discussed in sub-section III of this Detailed Description section, below.

Processing proceeds to operation S265, where activate/deactivate VM mod 306 deactivates VM instance 299a on server 103. More specifically, in this example, all of server 103 is being hibernated, and, accordingly, instance 299 is being hibernated with it. Hibernation is one form of deactivation where the deactivated code (in this example, a VM/container) is stored in non-volatile storage. The storage of instance 299 in non-volatile storage will be further discussed in connection with the next operation of method 250.

Now that proxy 305 is activated and instance 299 is deactivated, the subject of what proxy 305 does with the data communications (intended for instance 299) that it intercepts. In this example, the proxy's responsive action depends upon what address the data communication comes from as follows: (i) if the data communication comes from an address on a first address list (not separately shown in the Figures) then the proxy will re-activate the VM/container instance and sends a responsive message to the source of the data communication to inform that the VM/container will be up and running shortly; (ii) if the data communication comes from an address on a second address list (not separately shown in the Figures) then the proxy will send a responsive message to the source of the data communication to inform that the VM/container will be up at some predetermined time in the future; and (iii) if the data communication source address is no on the first or second lists, then proxy 305 simply discards the data communication as coming from a party not authorized to communicate with the target VM/container. Other types of responsive actions that various proxies, of various embodiments of the present invention, may be programmed to take may be discussed in the next sub-section of this Detailed Description section.

Processing proceeds to operation S270, where compression algorithm 310 of compression/decompression mod 308: (i) receives the data of VM instance 299a through communication network 114 and from server 103 (see FIG. 1); and (ii) compresses this data into compressed VM image 299b using compression algorithm 310. In this embodiment, compression algorithm 310 is a DEFLATE type compression algorithm. Alternatively, any type of compression algorithm (now known or to be developed in the future) may be used. In some embodiments, it may be preferable to use an agnostic file level compression algorithm (see discussion of this type of compression algorithm, above, in the Background section).

Processing proceeds to operation S275, where compressed VM image 299b is stored in compressed VM data store 312. In this embodiment, VM image 299b is stored in persistent storage (that is, hibernated) on a computer (specifically VM control computer 200 (see FIG. 1)) that is different that the server computer where the activated instance had previously been running (that is, server 103). Alternatively, the compressed VM/container image may be compressed and/or stored on the same computer where the image had been running as a VM/container instance. Because the image has been compressed, it takes up less storage space. It is even possible that in some embodiments, the compressed image will be small enough in data volume to be stored in a volatile data storage device.

Processing proceeds to operation S280, where compression algorithm 310 of compression/decompression mod 308: (i) determines that it is time to reactivate compressed VM image 299b; and (ii) in response, decompresses compressed VM image 299b, so that compressed VM image 299b becomes second active VM instance 299c (as will be discussed below in connection with operation S285). In this embodiment, the reactivation occurs because a predetermined time (specifically 5 AM East Coast time) has been reached. Alternatively, other conditions may trigger reactivation of a compressed and store VM/container image. Use of a dependence graph in re-activating VM/container images will be further discussed, below.

Processing proceeds to operation S285, where activate/deactivate VM mod 306 reactivates second active VM instance 299c on server 104. In this embodiment, the reactivated VM/container is run on a computer that is: (i) different than the one it was previously running on (that is, server 103) and (ii) different than the one where the compressed image was stored (that is, VM control computer 200). Alternatively, the instance may be deactivated, compressed, stored, decompressed and reactivated all on a single server computer. In these embodiments, the proxy will typically need to run on a computer that is not the hibernating server.

Processing proceeds to operation S290, where activate/deactivate proxy mod 304 deactivates proxy 305 because it is not needed now that VM instance 299c is running on server 104. Alternatively, the proxy may be maintained, but simply informed that the VM/container instance has been reactivated because this will probably have a huge impact on how the proxy handles data communications intended for the VM/container instance for which it is proxying.

Some embodiments of the present invention use a "dependence graph." This will be discussed in detail in the following sub-section of this Detailed Description section. For the time being, it is noted that dependence graphs cording to the present invention are data sets that include: (i) node data structures respectively representing VM/container instances; and (ii) connections (or edges) among and between various nodes representing relationships among and between the connected nodes. In some embodiments, these connections (or at least some of them) connect pairs of nodes that should be deactivated and/or reactivated together as a group. This will be further discussed, below, in connection with FIG. 4.

III. Further Comments and/or Embodiments

Some embodiments of the present invention recognize the following facts, potential problems and/or potential areas for improvement with respect to the current state of the art: (i) in any cloud computing environment, the balance between all available resources and those resources actively in use represents the efficiency of the environment; (ii) it is advantageous, from a cost standpoint, to minimize the number of available resources that are not also in use; (iii) the scalable and self-service nature of cloud provisioning encourages efficient allocation of resources, but rarely allows for optimization; (iv) a safe, but inefficient, solution to resource availability is to simply provide resources far in excess of anticipated need; (v) this approach minimizes the likelihood of unavailability, however it creates undesirable cost and maintenance requirements; and/or (vi) currently, resources can be stretched with respect to CPU (central processing unit) and memory.

Some embodiments of the present invention recognize the following facts, potential problems and/or potential areas for improvement with respect to the current state of the art: (i) existing optimization solutions have primarily employed cost drivers; (ii) existing optimization solutions encourage users to spin down resources when they are not in use in order to save on hosting charges; (iii) existing optimization solutions employ social motivators (such as publicly naming inefficiently using resources); (iv) existing optimization solutions employ repeated reminders (such as daily, weekly, or monthly queries as to VM (virtual machine) use); (v) to solve this (that is, the over-provisioning of cloud resources), the common approach is to levy a cost to the user in various ways; (vi) for a pay as you go model (PAYGO), the user pays directly, so the user is motivated to minimize the usage; and/or (vii) for a shared pool paid by an organization, a user does not have to pay so the cost may exist in some other form, such as one of the following: (a) hall of shame (cloud portal lists the users with the highest resource usage), (b) nagging by admin (occasional review requiring user to reconfirm usage), and/or (c) approval by admin (this requires work by the admin and may take away some of the self-service convenience).

Some embodiments of the present invention may include one, or more, of the following features, characteristics and/or advantages: (i) allows for the overprovisioning of cloud resources; (ii) hibernates unused resources to compressed or mass storage (based on dependency maps or history of use); (iii) restores those resources just in time based on anticipated or actual user requests; (iv) expands on memory and CPU management to incorporate the use of storage to improve resource efficiency; (v) attempts to stretch resources beyond their physical limit by virtualization and overbooking using storage; (vi) stretches resources with storage; (vii) determines in advance when to wake up the proxy for the system; and/or (viii) determines dependencies to determine what components can be shut down (sometimes herein referred to as the "policy").

In a method according to the present invention: (i) it is determined that a VM (or container) is not in use and has been idling for an extended time; (ii) responsive to the determination that the VM/container has been idling for an extended time, the VM/container is suspended; and (iii) the VM's disk space is then: (a) compressed, or (b) moved to mass storage. In some embodiments dealing with a container, if the container is stateless, it is not necessary to save the storage; if the container is stateful, the top layer of its file system needs to be saved. In some embodiments, when a request is made to the VM or container, a cloud service restores the disk by decompressing or reloading it from mass storage. In this case, the request needs to be captured via a proxy left running in place of the VM/container.

In a method according to the present invention: (i) it is detected that a VM is idle and put it to sleep; (ii) responsive to the detection, a surrogate VM is run in its place; (iii) the surrogate then handles some simple requests destined for the VM; (iv) the VM is then woken for more complex requests; (v) storage is then saved for more than CPU and memory; and (vi) the images are then compressed and stored away.

Some embodiments of the present invention may include one, or more, of the following features, characteristics and/or advantages: (i) uses more expensive and faster storage for systems with hierarchical storage (like SSD) effectively; (ii) covers VMs and containers; (iii) uses some early warning signals to pre-load the VM/containers; (iv) reduces the effective wake up time that is seen by a user or a system using the hibernated service; (v) uses a dependence graph to identify a group of VM/containers that cooperate; (vi) allows the whole group (of VM/containers) to wake up together, thereby avoiding a chain effect that lengthens the effective wake up time; (vii) uses a "proxy" instead of a "shadow VM," with the proxy having a very light-weight implementation (such as a process or even a simple modification of an existing tool like a DNS (Domain Name System)); and/or (viii) has a lower cost, and consequently is better at resource saving than a VM.

Some embodiments of the present invention may include one, or more, of the following features, characteristics and/or advantages: (i) accommodates (via cloud) more VM/container than the limit of the physical disks; (ii) requires no user interaction; and/or (iii) the operation is invisible to the user, except for some delay when the storage is being restored.

In the following paragraph, an example of the advantages to some embodiments of the present invention will be discussed. In one scenario, geographically distinct user populations can effectively share the same resources. For example, users in New York City can use a VM from 8:00 AM to 8:00 PM (beyond "normal business hours") and after 8:00 PM, the VM/container is hibernated to disk. Consequently, users in Shanghai can begin using a VM/container on the same hardware, from 8:00 AM to 8:00 PM in their local time. This represents an ideal situation in which the cloud resource is in use twenty-four hours a day, but only half of the resources are required, instead of keeping both the New York and Shanghai VMs up twenty-four hours per day and seven days per week.

In some embodiments, systems containing large resource packages such as training applications or simulators can effectively use resources by keeping the majority of applications and simulators offline. When a user logs into the system, and is recognized as being "in progress" on an application or simulator, or when the user searches for an application or simulator, that VM/container can be immediately spun up in the background. This makes the VM/container available with little or no delay upon the user's request for access. If any delay exists, the user is presented with a progress indicator that reflects the anticipated delay.

In some embodiments, resources or applications that are known to run only during particular time periods can be removed from active use when they are "out of cycle." For example, a company typically uses a performance evaluation system early in the year (for goal setting purposes) and late in the year (for evaluation purposes). Somewhere in between, the company uses a compensation tool that reflects the results of the evaluation and provides for a bonus and/or salary increase. In some embodiments, all of these HR systems can: (i) share the same cloud resources (CPU and memory); (ii) suspend applications to disk while not in use; and (iii) share resources while other applications are actively used.

Some embodiments of the present invention may include one, or more, of the following features, characteristics and/or advantages: (i) uses inexpensive resources (disk storage) to improve upon existing virtualization techniques; (ii) assigns hibernation policies/triggers/thresholds to a VM/container resource; (iii) triggers a hibernation and restoration event; (iv) determines dependencies and hibernation policies; (v) triggers a restoration event; (vi) determines (via a proxy function) when a VM or cluster needs to be restored; and/or (vii) orchestrates that restoration through the cloud management system.

In a method according to the present invention, triggering a hibernation and restoration event includes the following operations: (i) an agent on the hosting server monitors traffic to/from the VM or container; (ii) a policy defines the ports to be monitored, or, alternatively, lets the system monitor all ports; and (iii) after hibernation has occurred, the system overtakes the IP of the VM/container and leaves a proxy service for this IP, which will perform two tasks: (a) detects incoming traffic and resumes the VM/container, and (b) notifies the user that the service is resuming with some indication of the progress.

Some things to note with respect to the method embodiment of the previous paragraph: (i) the notification is supported for specific protocol such as http, telnet, ssh, etc.; (ii) the notification is optional and can be specified in the policy, along with the selected protocols and notification messages; (iii) the policy can specify the service resumption to be automatic or to require a confirmation from the user; and (iv) the hibernation/restoration affects the full chain of dependent VMs/containers as described in the dependency graph of the services.

Figure 5:
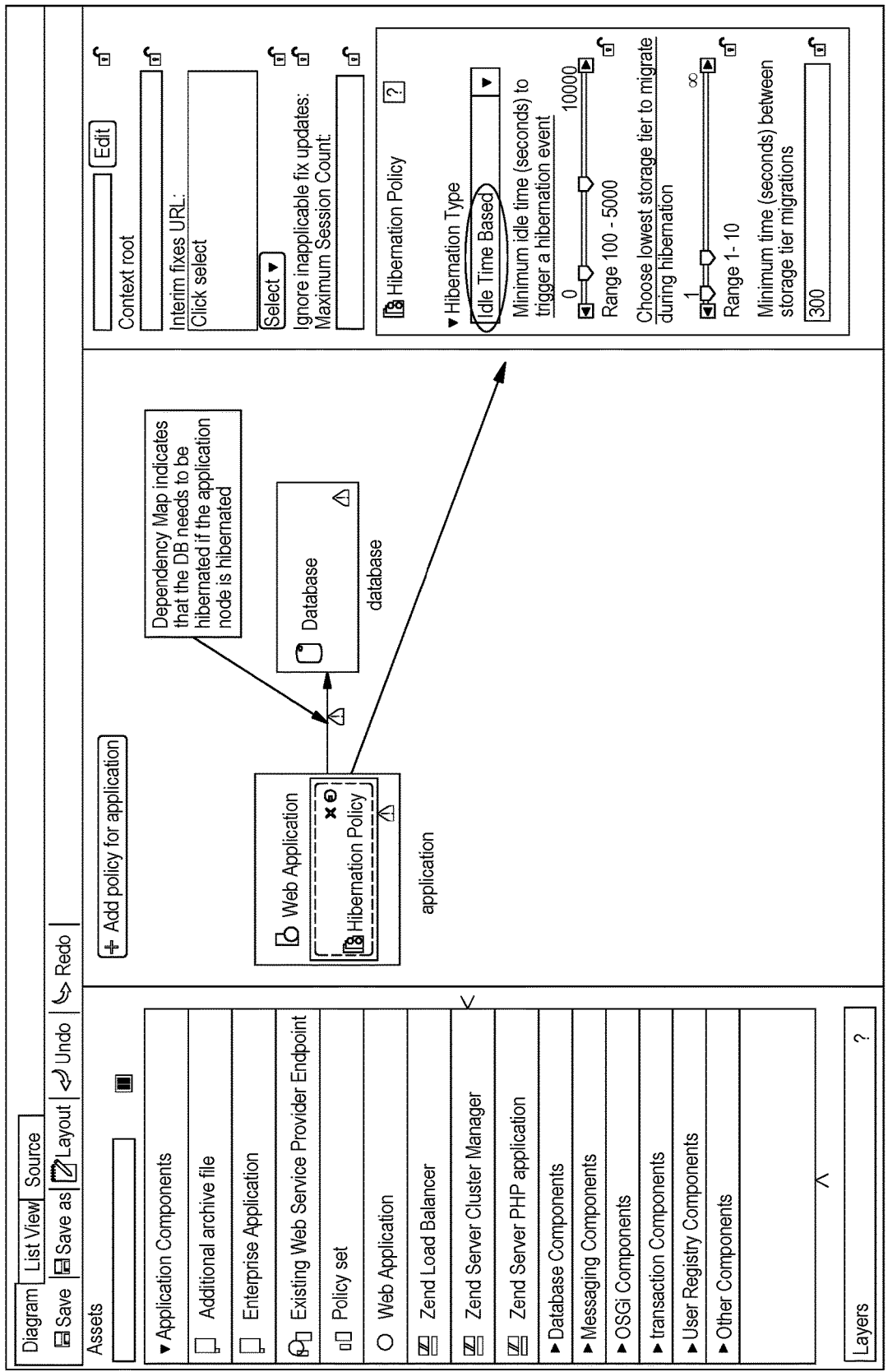
FIG. 5 is a screenshot view showing information that is helpful in understanding various embodiments of the present invention.

Screenshot 500 of FIG. 5 shows how dependencies and hibernation policies are determined. In order to define a hibernation policy, some embodiments of the present invention use the following operations: (i) user creates a pattern defining the relationships between various VMs; (ii) user attaches a Hibernation policy to one or more components; (iii) user defines attributes of the policy (see FIG. 5); (iv) user deploys pattern using cloud; (v) the hibernation policy monitors for the defined triggering conditions; and (vi) the hibernation policy initiates a hibernation event as appropriate. The portion of screenshot 500 labeled "Hibernation Policy" can be added to various cloud systems.

In order to define a dependency between VMs and/or containers, embodiments of the present invention use the following operations: (i) defines dependencies within the pattern; and (ii) uses the defined dependency map to trigger hibernation events when any VM/container with a dependency is also hibernated.

Figure 4:
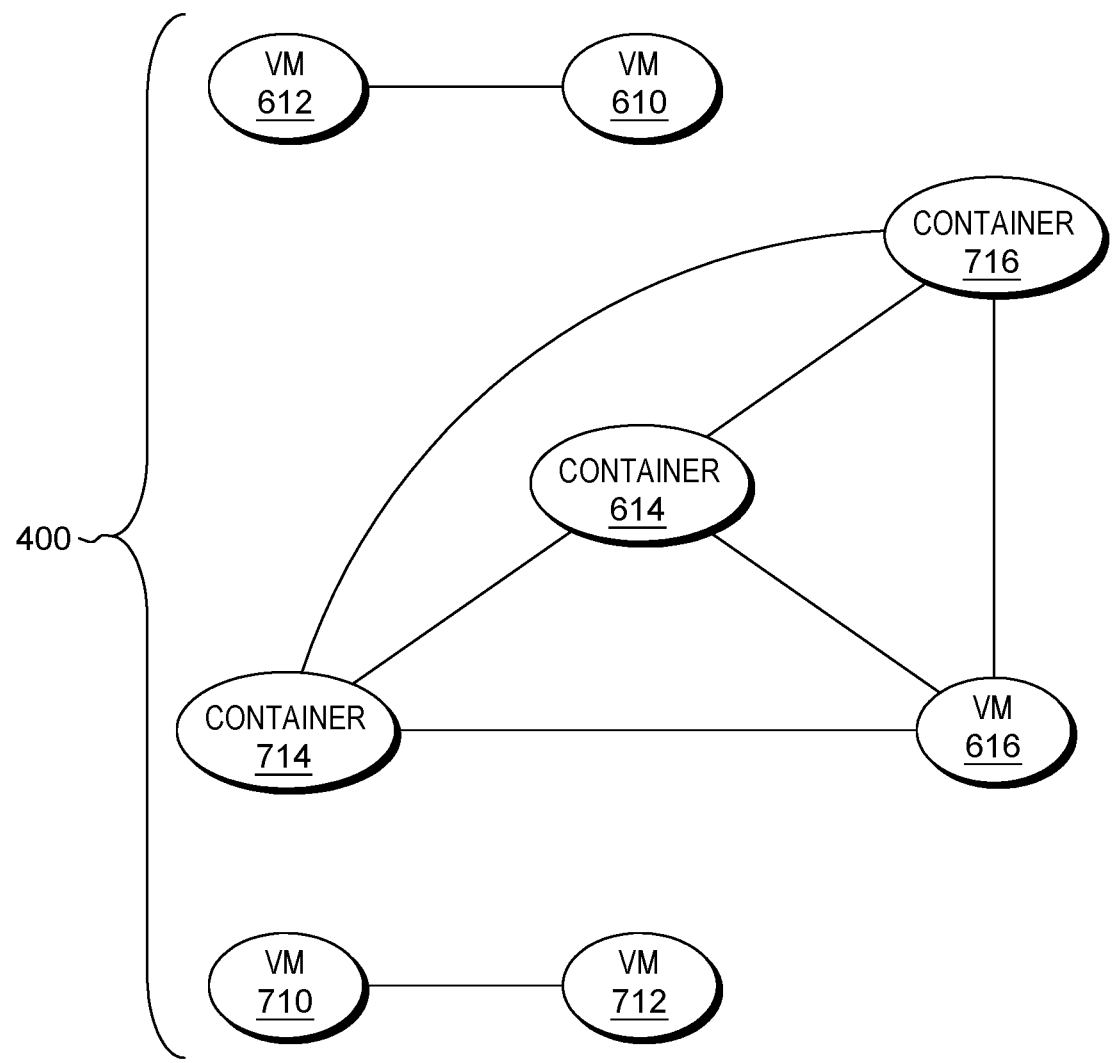
FIG. 4 is a dependency graph according to an embodiment of the present invention.

Block diagram 600 of FIG. 6 includes the following blocks: user icon block 602; client program block 604; proxy block 606; hypervisor block 608; and hibernating VM/container blocks 610 and 612. Between block 602 and block 604, the action of start client is performed. Between block 604 and block 606, the action of early warning is performed. Between block 606 and block 608, the action of restore related set of VM/containers 610 is at least partially performed. Between block 608 and blocks 610, the action of restore related set of VM/containers is at least partially performed. More specifically, related set of VM/containers are determined to be a related set 610 (to be hibernated/woke simultaneously) based on a dependency graph, where: (i) the various VMs and containers are represented as nodes of the dependency graph; and (ii) dependency relationships among and between the nodes are represented as connections among and between the nodes of the dependency graph. This dependency graph 400 is shown at FIG. 4 and includes VM nodes 610, 612, 616, 710 and 712; container nodes 614, 714 and 716; and connections among and between the nodes as shown in FIG. 4. The connections in FIG. 4 all represent connections between pairs of nodes representing VM/container instances that should be deactivated and/or reactivated at the same time. In dependence graph 400 there are three sets of nodes representing instances that should be deactivated/reactivated as a group.

Block diagram 700 of FIG. 7 includes the following blocks: user icon block 702; client program block 704; proxy block 706; hypervisor block 708; and hibernating VM/container blocks 710 and 712. Between block 702 and block 704, the action of log in is performed. Between block 704 and block 706, the action of initiate session is performed. Between block 706 and block 708, the action of wait for VM/container is performed. More specifically, related set of VM/containers are determined to be a related set 710 (to be hibernated/woke simultaneously) based on dependency graph 400, where: (i) the various VMs and containers are represented as nodes of the dependency graph; and (ii) dependency relationships among and between the nodes are represented as connections among and between the nodes of the dependency graph.

Block diagrams 600, 700 of FIGS. 6 and 7 show respective involvement of the client program, proxy, and the hypervisor with respect to hibernating a set of related VM/containers. In some embodiments, this can be done: (i) via a proxy (in an isolated scenario with no clustered environment), or (ii) via an early warning agent that sits on the end users' workstation (such as Citrix VDI). In some embodiments, restoring the VM/container or a collection of them is triggered by the actual usage of the service provided by these VM/containers. This process will be discussed in the following paragraphs.

First, as shown in block diagrams 600 and 700, a client program closest to the source that uses the service is started up or activated. The client then sends an early warning event to the proxy to signal that the VMs/containers will be needed imminently. Later, the proxy connects to the hosting server and requests that the VMs/containers to be restored out of hibernation. Examples of the client program includes: (i) a login screen for access to a virtual desktop (such as those commercially available from Citrix Systems software company) (for example, when it is started by the user, entering the login and password will take some time, and the program can send the early warning event to the proxy; (ii) URL access at the HTTP server (for example, the server detects that the URL is pointing to a particular application and sends the early warning event to the proxy); (iii) load balancing for web servers (such as, that provided by commercially available integration appliances; and (iv) for example, the routing algorithm in the load balancer will be able to: (a) monitor the trend of the web requests, (b) predict the need for additional capacity, and (c) send an early warning event to the proxy.

Second, the client program uses the service in the VM/container by sending request to the proxy. In some embodiments, if the early warning event did not occur, the proxy connects to the hosting server and requests for the VM/container to be restored out of hibernation. Otherwise, the proxy synchronizes with the hosting to wait for the VM/container to be restored. Third, the VM/container becomes active and starts serving the request.

In some embodiments, when a VM is hibernated, it is no longer active to serve incoming requests, so to prevent the requests from failing because of timeout, a proxy stands in place of the VM (or container) to capture the requests and initiate the reactivation. In this embodiment, the proxy is a program that understands the request protocol, and can be implemented in many ways depending on the environment. In some embodiments, the proxy program comes into existence when the VM/container is hibernated, and it is taken down when the VM/container is reactivated.

Some embodiments of the present invention may include one, or more, of the following features, characteristics and/or advantages: (i) creates a proxy when a VM is put to sleep, and the proxy listens for traffic and wakes the VM when appropriate; (ii) sends an early warning event to the proxy in anticipation of a future wake up event; (iii) determines the "dependency maps" which allow multiple VMs to be hibernated based on network and data dependencies; and (iv) determines (via the hibernation policy engine) when the ideal time is to hibernate.

In some embodiments, the early warning method (mentioned above) modifies elements like login dialogs (such as to Windows or Citrix or a VPN). In some embodiments, the early warning method sends an early warning to the proxy system at the time the dialog is created, which gives the proxy more time wake up the hibernated VM while the user is typing in their user ID and password. This allows the VM to be available with less delays. Additionally, some embodiments of the present invention create dependency maps, which allow multiple VMs to become hibernated as a group. This prevents VMs from the rubber band effect where a VM gets hibernated only to be restored immediately due to a downstream network dependency on another VM. It also allows VMs in a dependent relationship to be hibernated quicker while avoiding a cascading hibernation. In some embodiments, the hibernation policy allows for further optimization of the timing of hibernation events.

Some embodiments of the present invention may include one, or more, of the following features, characteristics and/or advantages: (i) use of a proxy, to substitute for a VM instance, that forces all data communications intended for the VM instance to come through; (ii) use of a proxy that has completely different applications and middleware on it than the destination server(s) that host the associated VM instance; (iii) use of a proxy that: (a) intercepts all requests (for example, an http URL) directed to the associated VM instance, and (b) takes responsive action when the proxy determines that the associated VM instance has been deactivated (for example, hibernated); (iv) for example, in some embodiments, the function of the proxy is to reply to the requesting user's web browser with a status message informing the requesting user of when the requested VM instance will be available; and/or (v) in some embodiments, the proxy will be located on a different machine than server(s) that host the VM/container instances because the entire hosting server is hibernated (and this is the reason that the VM/containers that is hosts are hibernated) and, therefore, unable to host the proxy for the VM/container instances that reside on it.

While a "proxy" (as that term is used herein) will take some responsive actions in response to data communications intended for a deactivated instance of a VM/container, the proxy must be lightweight in the sense that it cannot be a VM/container itself. That is, a proxy is not a "computing environment" like VMs and containers are. For example, a proxy is different than a "shadow VM" that is an exact, or substantially similar, copy of another VM instance. The reason a proxy is lightweight is that running a full-scale replacement VM would defeat the computational resource saving objective of deactivating the VM/container in the first place. In other words, the proxy must also be lightweight in the sense that actively running the proxy must consume substantially less computational resources than running the VM/container does.

IV. Definitions

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Including/include/includes: unless otherwise explicitly noted, means "including but not necessarily limited to."

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

VM/container: any set of data and/or instructions that emulate a computing environment; VM/containers include, but are not necessarily limited to VMs and containers.

What is claimed is:

1. A computer-implemented method comprising:
actively running a first instance of a VM/container on a first computer device;
receiving a first request to deactivate the first instance of the VM/container;
responsive to the first request to deactivate, storing an image of the first instance, with the storing including:
generating an uncompressed image file data set corresponding to the first instance,
compressing, by a file level data compression algorithm, the uncompressed image file data set to generate a compressed image file data set, and with the file level data compression algorithm being a DEFLATE type compression algorithm, and
storing the compressed image file data set in a data storage device;
deactivating, by a first proxy, the first instance of the VM/container;
responsive to the deactivation of the first instance of the VM/container, receiving, by the first proxy, a first data communication from an address on a first address list;
responsive to the receipt of the first data communication, reactivating, by the first proxy, the first instance of the VM/container based, at least in part, upon the first data communication being from the address on the first address list;
receiving a second request to deactivate the first instance of the VM/container;
deactivating, by the first proxy, the first instance of the VM/container;
responsive to the deactivation of the first instance of the VM/container, receiving, by the first proxy, a first data communication from an address on a second address list; and
responsive to the receipt of the first data communication from the address on the second list, sending, by the first proxy, a responsive message to a source of the first data communication from the address on the second list to indicate that the first instance of the VM/container will be re-activated at a predetermined future time.

2. The method of claim 1 wherein the data storage device is a non-volatile data storage device.

3. The method of claim 1 further comprising:
receiving a request to reactivate the first instance of the VM/container; and
responsive to the request to reactivate, reactivating the first instance of the VM/container, with the reactivation including:
reading the compressed image file data set from the data storage device,
decompressing, by the file level data compression algorithm, the compressed image file data set to generate a decompressed image file data set corresponding to the first instance of the VM/container, and
activating the decompressed image file data set to begin actively running again the first instance of the VM/container.

4. The method of claim 3 wherein the VM/container is a virtual machine.

5. The method of claim 3 wherein the VM/container is a container.

6. The method of claim 1 wherein the file level compression algorithm is agnostic.

7. The method of claim 1 wherein the file level compression algorithm is one of the following types: PKZIP, Gzip, tar, 7z, RAR.

8. The method of claim 1 further comprising:
determining that the first computer device is going into hibernation;
wherein the request to deactivate is made in response to the determination that the first computer device is going into hibernation.

9. The method of claim 1 further comprising:
determining that the first instance of the VM/container has been idle a predetermined amount of time;
wherein the request to deactivate is made in response to the determination that the VM/container has been idle a predetermined amount of time.

* * * * *